(12) United States Patent
Ponoth et al.

(10) Patent No.: US 8,754,483 B2
(45) Date of Patent: Jun. 17, 2014

(54) LOW-PROFILE LOCAL INTERCONNECT AND METHOD OF MAKING THE SAME

(75) Inventors: Shom Ponoth, Albany, NY (US); David V. Horak, Essex Junction, VT (US); Charles W. Koburger, III, Albany, NY (US); Chih-Chao Yang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 325 days.

(21) Appl. No.: 13/169,081

(22) Filed: Jun. 27, 2011

(65) Prior Publication Data
US 2012/0326237 A1    Dec. 27, 2012

(51) Int. Cl.
*H01L 29/788*    (2006.01)
(52) U.S. Cl.
USPC ............................ 257/377; 257/576; 257/774
(58) Field of Classification Search
USPC ........................................ 257/377, 576, 774
See application file for complete search history.

(56) References Cited

U.S. PATENT DOCUMENTS

| | | | |
|---|---|---|---|
| 6,080,624 A * | 6/2000 | Kamiya et al. | 438/257 |
| 6,165,858 A * | 12/2000 | Gardner et al. | 438/305 |
| 6,300,666 B1 * | 10/2001 | Fechner et al. | 257/503 |
| 6,534,389 B1 | 3/2003 | Ference et al. | |
| 6,861,701 B2 | 3/2005 | Williams et al. | |
| 6,924,184 B2 | 8/2005 | Cave et al. | |
| 7,279,419 B2 | 10/2007 | Kim et al. | |
| 7,411,247 B2 | 8/2008 | Ogura et al. | |
| 7,560,808 B2 | 7/2009 | Korec et al. | |
| 7,888,774 B2 | 2/2011 | Drynan | |
| 7,911,013 B2 | 3/2011 | Wise | |
| 2002/0160595 A1 | 10/2002 | Hineman | |
| 2005/0148118 A1 | 7/2005 | Zheng et al. | |
| 2008/0157160 A1 * | 7/2008 | Chan | 257/315 |

FOREIGN PATENT DOCUMENTS

| | | |
|---|---|---|
| EP | 1069620 | 1/2001 |
| WO | 2008014038 A1 | 1/2008 |

OTHER PUBLICATIONS

Notification of Transmittal of the International Search Report and the Written Opinion of the International Searching Authority, or the Declaration dated Nov. 14, 2012.
U.S. Appl. No. 12/913,143.

* cited by examiner

*Primary Examiner* — Julio J Maldonado
*Assistant Examiner* — Mohammad Choudhry
(74) *Attorney, Agent, or Firm* — Yuanmin Cai (57) ABSTRACT

Embodiments of the present invention provide a structure. The structure includes a plurality of field-effect-transistors having gate stacks formed on top of a semiconductor substrate, the gate stacks having spacers formed at sidewalls thereof; and one or more conductive contacts formed directly on top of the semiconductor substrate and interconnecting at least one source/drain of one of the plurality of field-effect-transistors to at least one source/drain of another one of the plurality of field-effect-transistors, wherein the one or more conductive contacts is part of a low-profile local interconnect that has a height lower than a height of the gate stacks.

14 Claims, 9 Drawing Sheets

LOW-PROFILE LOCAL INTERCONNECT AND METHOD OF MAKING THE SAME

FIELD OF THE INVENTION

The present invention relates generally to the field of semiconductor device manufacturing and in particular relates to structure of low-profile local interconnect and method of making the same.

BACKGROUND OF THE INVENTION

State of art procedure of forming contacts and/or local interconnects for semiconductor devices, such as field-effect-transistors, generally involves steps of depositing and then planarizing an insulating pre-metal dielectric ("PMD") layer on top of the semiconductor devices; forming one or more contact and/or local interconnect masks on top of the PMD layer to create a pattern of holes or openings inside the PMD layer; and damascening conductive material into the holes or openings in the PMD layer to form the contacts (CAs) and/or local interconnects (LIs).

For many generations, and in particular as dimensions of structures being contacted shrink below 100 nm, process control of the above "contact hole etching" approach is becoming increasingly difficult and problematic. For example, process issues were observed relating to: 1) erosion of gate sidewall films and/or spacers which are normally made of nitride; and 2) erosion of substrate/silicide at the bottom of CA/LI holes. Gate sidewall films are used to protect the gate from shorting to the CA/LI, and so erosion of these films may cause decrease in device yield and increase in leakage current when image size and overlay conspire to overlap the CA/LI with the gate. Similarly, substrate/silicide erosion may cause leakage as well. Moreover, because rate of blanket etching used in the process is generally very high, it is very difficult to achieve zero-to-tiny erosion in very small spaces. During a lithographic process, features must be printed larger than their desired final dimensions in order to guarantee image quality, and subsequently the printed features must be shrunk during etching processes. Controlling of this shrinkage process is becoming a major challenge for increasingly-small holes with variability over a larger portion of the overall image size. It is difficult to avoid the above problems through feature size/placement control.

One approach to address above problems is to add an etch-stop layer underneath the PMD layer. Liners made of nitride were originally used for this purpose. However, the required thickness of nitride is filling gate-to-gate space quickly, at dimensions that are comparable to those common for 22 nm, and beyond, nodes. As a result, increased nitride over-etching as part of the CA/LI formation process is often required. Other approaches to address above problems may include using other types of etch-stop layers such as $HfSiO_x$ which has different property from nitride. However, the use of $HfSiO_x$ may add unwanted capacitance (since the dielectric constant of $HfSiO_x$ is very high) to the device in addition to that the process of removing $HfSiO_x$ after PMD etch has yet to be demonstrated as reliable.

In addition, conventional approaches generally create an interconnect structure that has a height that is at least the height of gate stack of the field-effect-transistor. In order to form the next level metal contact, commonly known as M1 metal line, a dielectric insulating layer is generally required in-between in order to maintain an adequate space between the M1 metal line and the interconnect structure underneath to avoid shorting.

SUMMARY OF EMBODIMENTS OF THE INVENTION

Embodiments of the present invention provide a structure which may be, for example, a semiconductor structure. The structure includes a plurality of field-effect-transistors having gate stacks formed on top of a semiconductor substrate with the gate stacks having spacers formed at sidewalls thereof; and one or more conductive contacts formed directly on top of the semiconductor substrate and interconnecting at least one source/drain of one of the plurality of field-effect-transistors to at least one source/drain of another one of the plurality of field-effect-transistors, wherein the one or more conductive contacts is part of a low-profile local interconnect (LPLI) with the LPLI having a height lower than a height of the gate stacks.

In one aspect of the invention, the one or more conductive contacts of the LPLI are formed directly adjacent to the spacers of the gate stacks.

In one embodiment, the structure may further include one or more vias formed on top of the one or more conductive contacts and directly next to the spacers of the gate stacks.

In one aspect of the invention, the one or more vias are made of a same material as that of the one or more conductive contacts, and have a same height as the height of the gate stacks.

In another embodiment, with the gate stacks including a cap layer on top thereof, the structure further includes a conductive path line formed directly above, but not in contact with, the one or more conductive contacts of the LPLI, the conductive path line being formed on top of and in contact with the cap layer of at least one of the gate stacks.

In one aspect of the invention, the conductive path line is insulated from the one or more conductive contacts underneath thereof by a layer of dielectric material.

In another aspect of the invention, the conductive path line is in contact with at least one of the one or more vias, and is electrically connected to at least one of the one or more conductive contacts through the one or more vias.

In yet another aspect of the invention, the conductive path line is in contact with at least one of the gate stacks through an opening formed in the cap layer on top thereof, the opening is filled with a conductive material.

BRIEF DESCRIPTION OF THE DRAWINGS

The present invention will be understood and appreciated more fully from the following detailed description of preferred embodiments, taken in conjunction with the accompanying drawings of which.

It will be appreciated that for the purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

Figure 1:
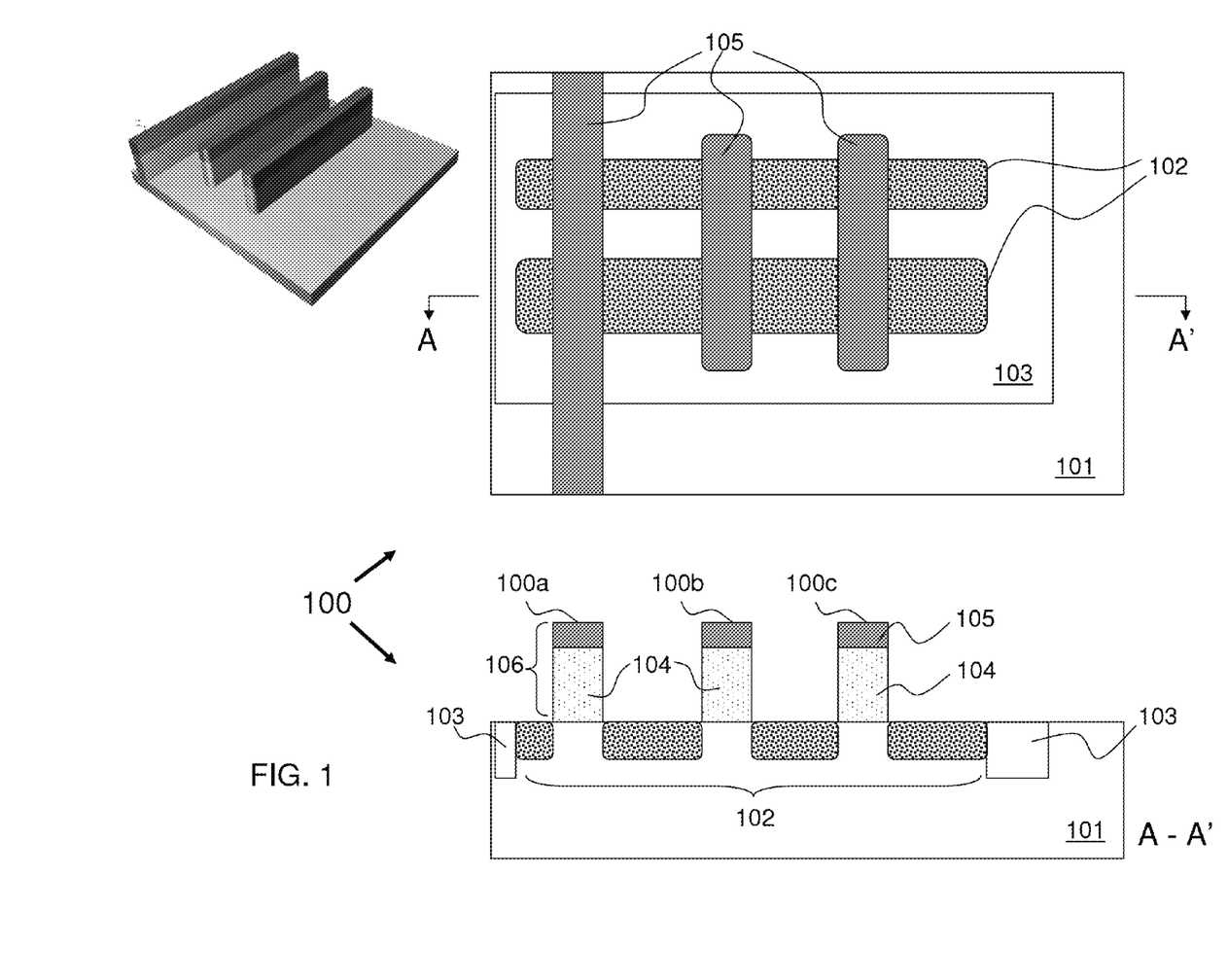
FIG. 1 is a demonstrative illustration of top and cross-sectional views of a semiconductor structure during a process of manufacturing thereof according to an embodiment of the present invention.

FIG. 1 is a demonstrative illustration of top and cross-sectional views of a semiconductor structure during a process of manufacturing thereof according to an embodiment of the present invention. For better understanding and further comprehension, FIG. 1 also includes a perspective view of the semiconductor structure although references, in the below detailed description, will be made only to the top and cross-sectional views of the structure. For the same intended purpose, other figures in this application may also include perspective views of the semiconductor structure at various manufacturing stages, wherever and whenever it is appropriate and/or necessary.

In order to make semiconductor structure 100 which may be, for example, a semiconductor chip or a wafer or a part thereof, embodiment of the present invention provides a method of manufacturing that starts with a semiconductor substrate 101 as is shown in FIG. 1. The method may include forming one or more active silicon islands 102 in semiconductor substrate 101. Active silicon islands 102 may be formed and/or designated as areas upon which one or more field-effect-transistors (FETs) may be built. Active silicon islands 102 generally include a channel region, and a source region and a drain region that are next to the channel region. Active silicon islands 102 are formed to be isolated from the rest of substrate 101 by one or more shallow-trench-isolation (STI) regions 103.

Embodiment of the present invention may further include forming one or more gate electrodes, which may be collectively referred to hereinafter as gate electrode lines 104, over the channel regions in active silicon islands 102 with a gate dielectric layer (not shown) being generally disposed between gate electrode lines 104 and active silicon islands 102. The gate dielectric layer may be comprised or made of silicon dioxide ($SiO_2$), hafnium-oxide (HfO), hafnium-silicon-nitride-oxide ($HfSiO_xN_y$), or any other suitable gate dielectric material. On the other hand, gate electrode lines 104 may be made of conductive materials such as, for example, various metals and may be capped with a cap layer 105. Cap layer 105 may be made of dielectric material such as, for example, silicon-nitride ($Si_3N_4$), or other proper insulating material and, according to one embodiment, may be carefully selected to be suitable for being used as a polish-stopping layer in a later manufacturing stage, as being discussed below in more details with reference to FIG. 3. In one embodiment, in order to increase selectivity during a spacer removal process as some situations may require, cap layer 105 may be preferably made from a both chemically and thermally stable material such as, for example, silicon-carbide SiC or silicon-carbon nitride SiCN that can withstand conditions of a standard nitride spacer removal process.

As being illustrated in FIG. 1, semiconductor structure 100 may include one or more groups of FET such as FET group 100a, 100b, and 100c. Each FET group may include a gate electrode line 104 and a cap layer 105 on top thereof. Collectively, a gate electrode line 104 and a cap layer 105 on top thereof may be referred to hereinafter as a gate stack 106.

Figure 2:
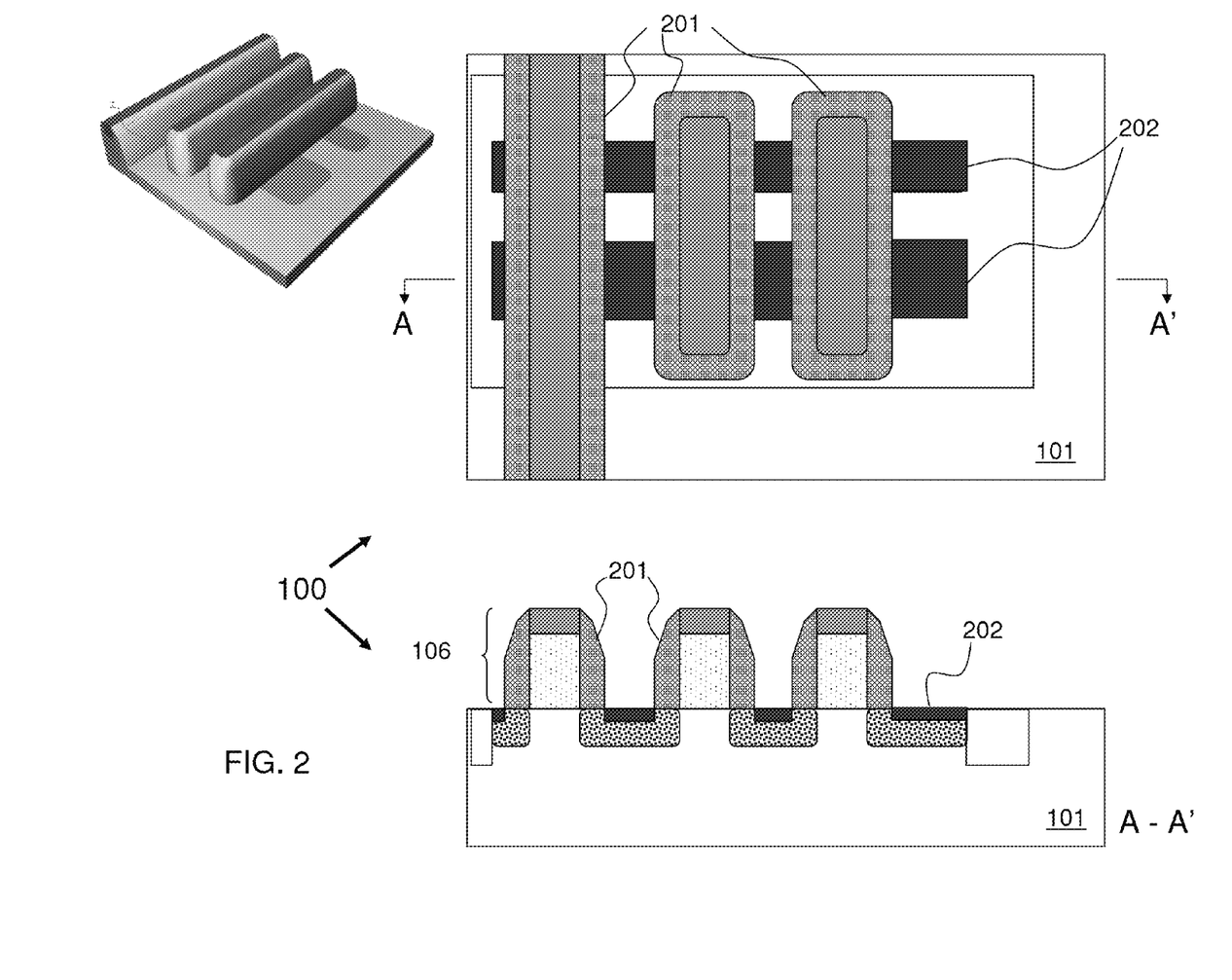
FIG. 2 is a demonstrative illustration of top and cross-sectional views of a semiconductor structure during a process of manufacturing thereof, following the step shown in FIG. 1, according to an embodiment of the present invention.

FIG. 2 is a demonstrative illustration of top and cross-sectional views of semiconductor structure 100 during a process of manufacturing thereof, following the step shown in FIG. 1, according to an embodiment of the present invention. Following the formation of gate stacks 106 as shown in FIG. 1, gate spacers 201 may be formed next to sidewalls of gate stacks 106 using any regular and/or standard front-end-of-line (FEOL) technologies as known in the art. A spacer 201 may be a single layer spacer or a multi-layer spacer having different layers of same or different materials. For example, spacers 201 may be made of layer(s) of nitride and/or oxide materials. As a result, gate electrode 104 may be encapsulated by dielectric cap layer 105 at the top and insulating spacers 201 at sidewalls thereof. Separately and/or subsequently, source and drain regions of FET groups 100a, 100b, and 100c may be subjected to a salicidation process which forms silicides 202, such as nickel-silicide, at a top surface of at least part of silicon islands 102. Silicides 202 improve conductivity of source and drain of FET groups 100a, 100b, and 100c and are generally used for forming electric contacts thereupon.

After forming gate stacks 106 and surrounding gate spacers 201 as in FIG. 2, conventionally an insulating layer of pre-metal dielectric ("PMD") material is deposited on top of substrate 101 to cover FET groups or devices 100a, 100b, and 100c; contact holes or local interconnect openings are created inside the PMD layer; and subsequently the holes or openings are filled with metal or conductive materials to form contacts or local interconnects. However, according to embodiments of the present invention, instead of forming an insulating PMD layer at this stage, a blanket conductive layer may be deposited on top of substrate 101 and FET devices 100a, 100b, and 100c, with the blanket conductive layer containing suitable material or layers of suitable materials for local interconnects.

Embodiment of the present invention may be applied to FET devices that are formed through other existing or future developed processes and/or technologies such as, for example, may be applied to FET devices that are manufactured through a replacement-metal-gate (RMG) process. Assuming FIG. 2 also demonstratively illustrates FET devices that are manufactured by a RMG process, electrode line 104 of FET devices 100a, 100b, and 100c may be a replacement metal gate, which may include one or more work-function adjusting metal liners or films lining, therefore next to, spacers 201 and a top surface of the channel region underneath the gate. Replacement metal gate 104 may be covered by a dielectric cap layer 105, after a dielectric layer that normally surrounds gate stacks 106 and spacers 201 during the process of forming replacement metal gates, as is known in a RMG process, is removed.

Figure 3:
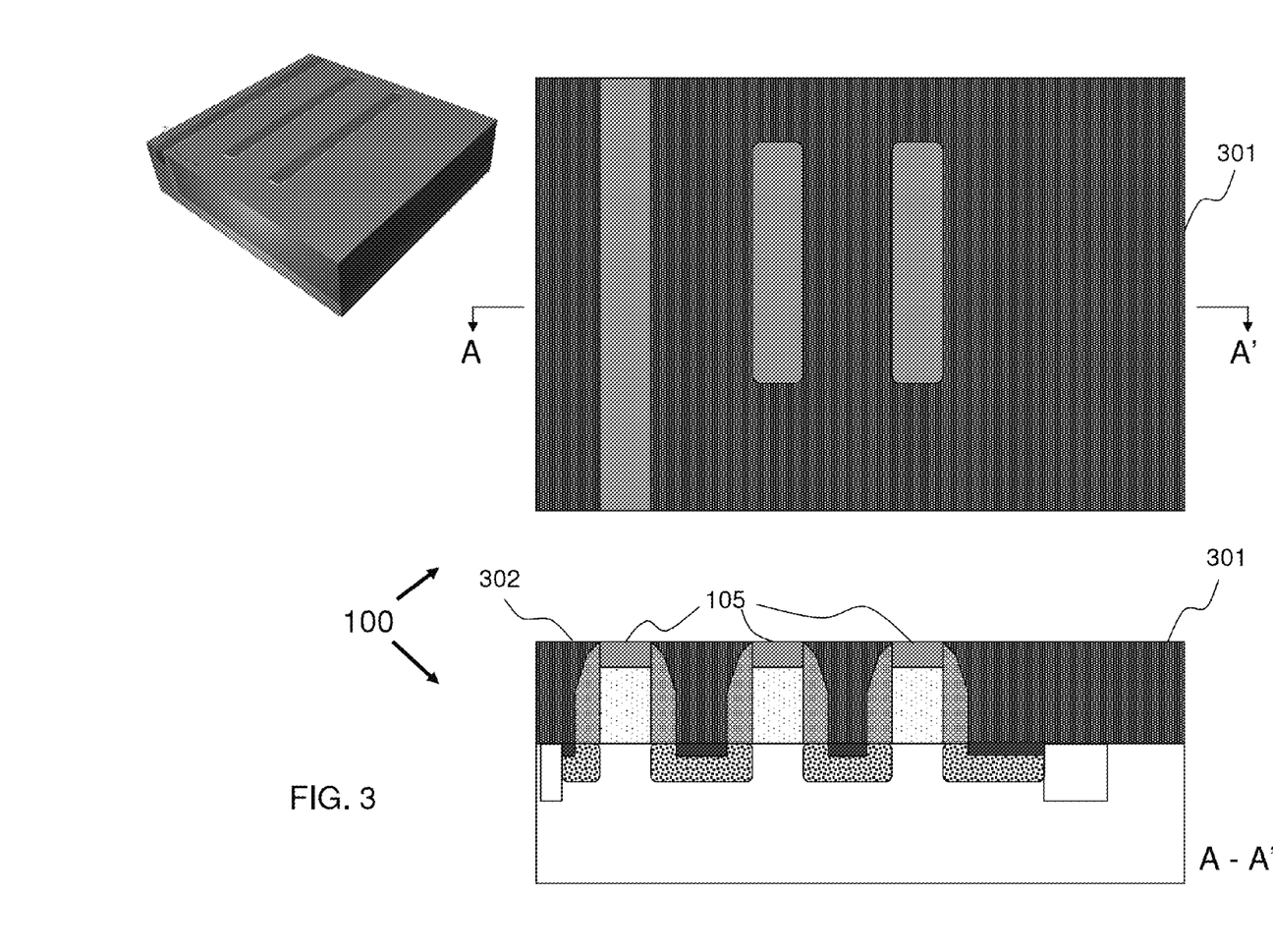
FIG. 3 is a demonstrative illustration of top and cross-sectional views of a semiconductor structure during a process of manufacturing thereof, following the step shown in FIG. 2, according to an embodiment of the present invention.

FIG. 3 is a demonstrative illustration of top and cross-sectional views of semiconductor structure 100 during a process of manufacturing thereof, following the step shown in FIG. 2, according to an embodiment of the present invention. More specifically, embodiment of the present invention may include depositing a blanket layer of conductive material 301 that covers most areas of semiconductor structure 100 including substrate 101 and FET devices 100a, 100b, and 100c. For example, blanket conductive layer 301 may cover at least areas where contacts and local interconnects are to be formed. In one embodiment, blanket conductive layer 301 may have a thickness such that it covers not only substrate 101 but also cap layer 105 that is on top of gate electrode line 104. In other words, the entire top surface of semiconductor structure 100 may be covered by blanket conductive layer 301.

Material of conductive layer 301 may include, for example, aluminum, nickel, copper, tungsten, or a combination thereof in a multi-layer form. For example, conductive layer 301 may be made of a layer of tungsten (W) on top of a thin aluminum (Al) layer with the Al layer lining the structure underneath. Structure of such a multi-layer form may facilitate a selective etching process of this conductive layer 301 as being described below in more details with reference to FIG. 4. Depending upon the type of material being used for conductive layer 301, deposition of conductive layer 301 may be made through, for example, a plating process, a chemical vapor deposition process, a sputtering process, any other existing or future-developed processes, and/or a combination thereof.

Following the formation of blanket conductive layer 301, one embodiment of the present invention may include polishing conductive layer 301 through, for example, a chemical-mechanic polishing (CMP) process to produce or create a flat top surface 302. During the CMP process, cap layers 105, which may be made of silicon-nitride as being described above for example and have a polishing characteristic that is sufficiently different from that of conductive layer 301, may serve as a polish-stopping layer such that the CMP process stops when cap layers 105 on top of gate electrode lines 104 are exposed. Preferably, all the insulating cap layers 105 on top of gate electrode lines 104 are exposed through the CMP process and, in ensuring this, some level of erosion of insulating cap layers 105 may occur but such erosion is acceptable to a certain extent.

Figure 4:
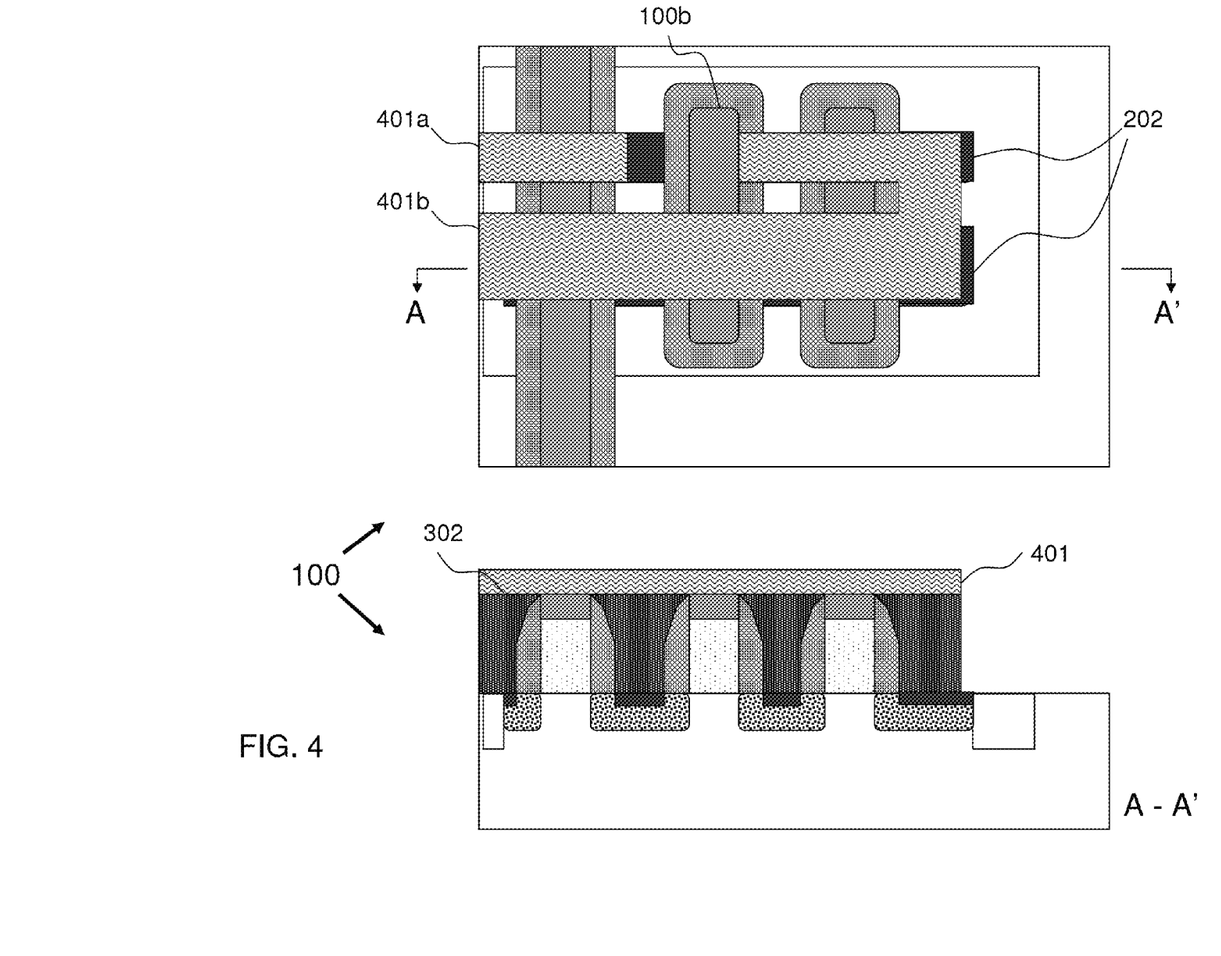
FIG. 4 is a demonstrative illustration of top and cross-sectional views of a semiconductor structure during a process of manufacturing thereof, following the step shown in FIG. 3, according to an embodiment of the present invention.

FIG. 4 is a demonstrative illustration of top and cross-sectional views of semiconductor structure 100 during a process of manufacturing thereof, following the step shown in FIG. 3, according to an embodiment of the present invention. For example, once all the insulating cap layers 105 are exposed, which are now surrounded by conductive layer 301 of local interconnect material, a photo-resist pattern 401, which represents shapes of contacts and/or local interconnects to be formed, may be formed on top of surface 302. Areas where no contacts and local interconnects are expected are not covered by photo-resist pattern 401 and left exposed.

For example, as a non-limiting example, photo-resist pattern 401 may include resist shape 401b for a borderless local interconnect and resist shape 401a for a partially-bordered local interconnect. Using photo-resist pattern 401 (including both 401a and 401b) as a protective mask, exposed portion of conductive layer 301 may be etched away. Preferably, etching of conductive layer 301 is made through a reactive-ion etching process (RIE), or any other suitable technique, that is selective to silicide 202 (FIG. 2), thereby causing minimal damage to affect conductivity of sources and drains of FET devices 100a, 100b, and 100c. For example, a combination of tungsten (W) and aluminum (Al) may be used as conductive layer 301. While tungsten (W) may be generally preferred as material for contacts or local interconnects for low resistance, a layer of aluminum (Al) underneath tungsten (W) may increase etching selectivity with regard to silicide 202, thereby reducing potential damage to silicide 202 due to over-etching when directly etching tungsten selective to silicide 202. In the meantime, in order to minimize increase in resistance of the local interconnect, a thin aluminum layer may be used.

In one embodiment, the etching process of conductive layer 301 may be made or designed through, for example, careful selection and adjustment of applied chemicals to be anisotropic thereby producing slopes that are within acceptable range. In addition, spacing between local interconnects and gate electrode lines may also be properly designed by adjusting, for example, a distance between photo-resist shape 401a and cap layer 105 of the center FET group 100b for the case shown in FIG. 4. In other instances, some local interconnects, for example local interconnect represented by resist shape 401b, may cross multiple silicon islands and be formed on top of isolators such as STI 103.

Figure 5:
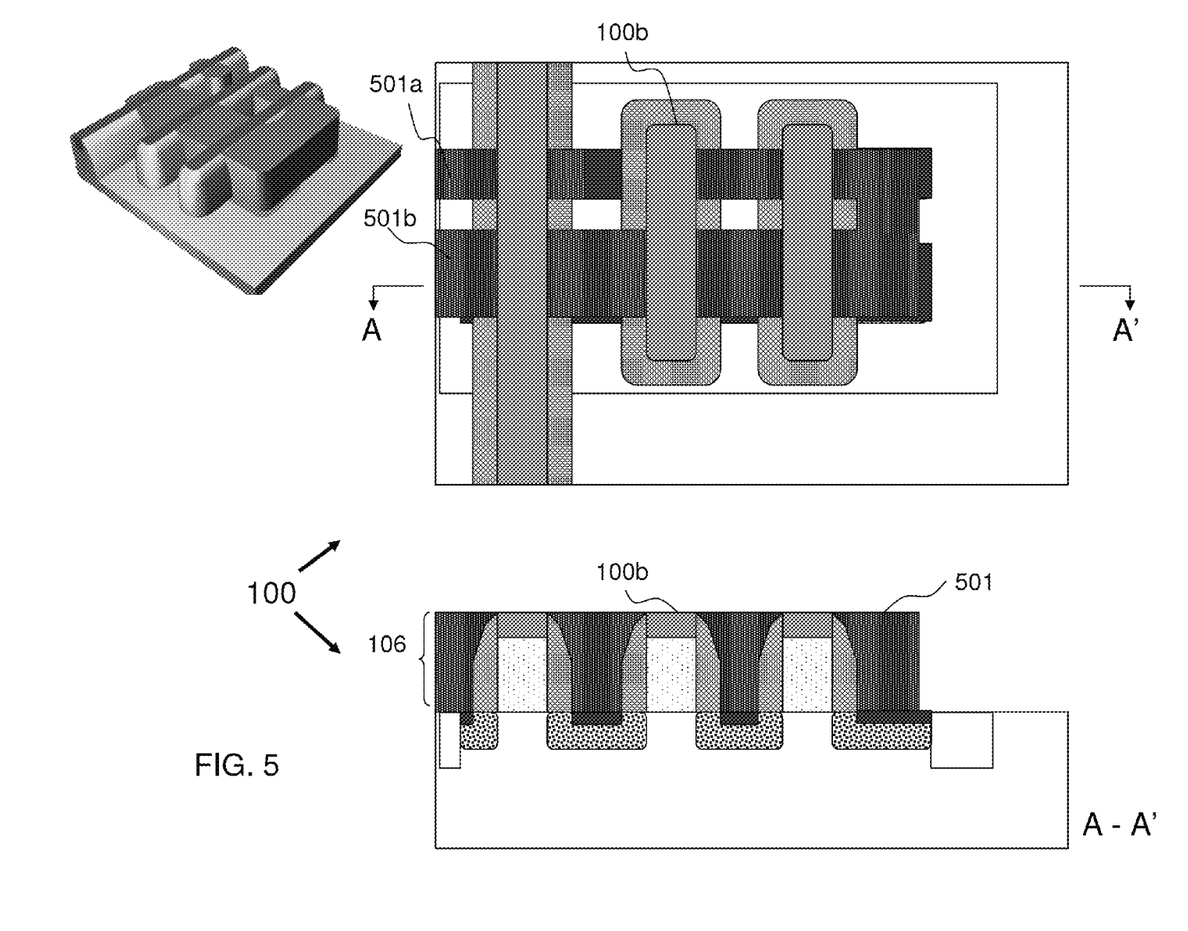
FIG. 5 is a demonstrative illustration of top and cross-sectional views of a semiconductor structure during a process of manufacturing thereof, following the step shown in FIG. 4, according to an embodiment of the present invention.

FIG. 5 is a demonstrative illustration of top and cross-sectional views of semiconductor structure 100 during a process of manufacturing thereof, following the step shown in FIG. 4, according to an embodiment of the present invention. After etching away exposed and un-protected conductive layer 301 through for example a RIE process, photo-resist pattern 401 may be lifted or removed using any well-known solvent, thereby exposing the underneath local interconnect structures 501a and 501b, which may be referred to as "bulk" local interconnect (BLI) in the present application. A typical characteristic of bulk local interconnects 501a and 501b is that they have a height that is the same as that of gate stack 106.

Furthermore, bulk local interconnects 501b formed by resist pattern 401b may be borderless BLIs having no border with gate stack 106 while bulk local interconnect 501a formed by resist pattern 401a may be a partially-borderless BLI which has a border with the gate stack 106 in the center FET, which is part of FET group 100b. Unlike any conventional way of forming local interconnect where contact holes need to be properly aligned with the underneath FET devices, bulk local interconnect structures 501a and 501b formed according to embodiment of the present invention, as being described above, are self-aligned to the gate electrodes or electrode lines of underneath FET devices because they are directly deposited onto the devices, with material on top of the gate electrode being removed via a planarization process.

Figure 6:
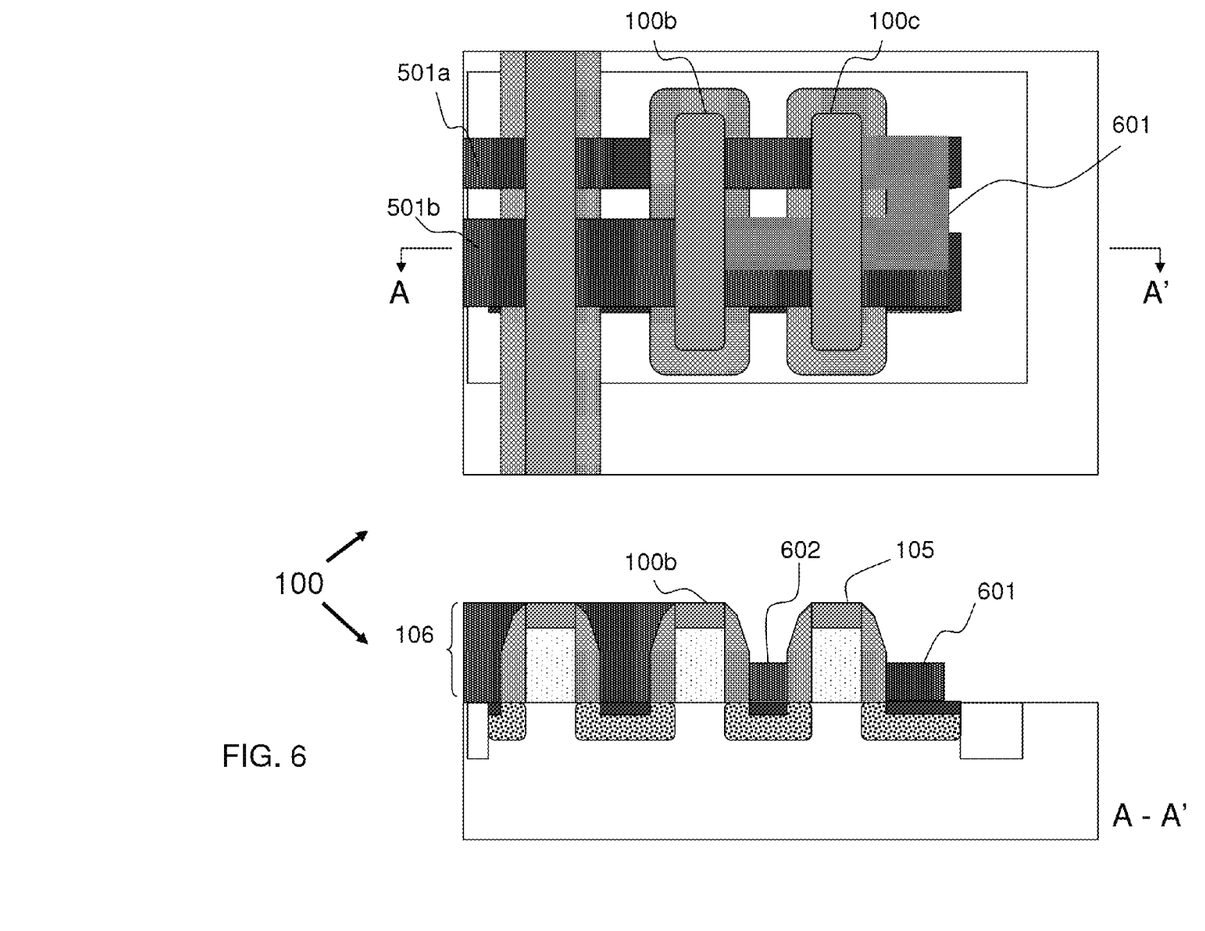
FIG. 6 is a demonstrative illustration of top and cross-sectional views of a semiconductor structure during a process of manufacturing thereof, following the step shown in FIG. 5, according to an embodiment of the present invention.

FIG. 6 is a demonstrative illustration of top and cross-sectional views of semiconductor structure 100 during a process of manufacturing thereof, following the step shown in FIG. 5, according to an embodiment of the present invention. After forming bulk local interconnects 501a and 501b through removing un-protected conductive layer 301, embodiment of the present invention may includes selectively lowering the height of some portion or portions of bulk local interconnects 501a and 501b to form a set of low-profile local interconnects (LPLI). For example, height of a first portion of bulk local interconnect 501b, to the right of FET group 100c as being illustrated in FIG. 6, may be lowered to create a U-shape conductive contact which may be part of a low-profile local interconnect structure 601. The U-shape conductive contact has a height lower than that of cap layer 105 that situates at the top of FET group 100c. Further for example, height of a second portion of bulk local interconnect 501b, between FET groups 100b and 100c as being illustrated in FIG. 6, may be lowered to create another conductive contact which may be a part of another low-profile local interconnect structure 602. Sometimes, low-profile local interconnects 601 and 602 may be collectively referred to as a single LPLI. The formation of low-profile local interconnects 601 and 602 saves precious real estate spaces in a vertical direction which enables to form metal level-1 (M1) conductive path line in a position that is lower than those in a conventional structure, as being described below in more details.

The lowering of height of portions of bulk local interconnects 501a and/or 501b may be achieved by subjecting bulk local interconnects 501a and/or 501b to, for example, a lithographic patterning and selective etching process among many other techniques. For example, according to one embodiment, a sacrificial layer may be formed through deposition around bulk local interconnects 501a and 501b to create a surface co-planar with bulk local interconnects 501a and 501b. A standard photolithographic patterning process may then be applied to form a photo-resist pattern of the LPLI. After removing the exposed photo-resist in the area of LPLI pattern, selective etching such a RIE process may be applied to remove a top portion of the un-protected conductive layer 301 which is part of the bulk local interconnects 501a and/or 501b, thereby forming the LPLI pattern. The LPLI is formed borderless, directly adjacent to spacers 201 of gate stack 106.

According to another embodiment, the formation of low-profile local interconnects 601 and 602 may be performed concurrently at the stage when bulk local interconnects 501a and 501b are formed. For example, after un-protected conductive layer 301 is partially etched away during the step of forming bulk local interconnects 501a and 501b, photo-resist mask 401 may be replaced with a new photo-resist mask that may represent the new shape of low-profile local interconnects 601 and 602, causing part of the previously protected conductive layer 301 (under photo-resist mask 401) to be etched concurrently with the rest of the conductive layer 301 that has been etched so far. LPLI 601 and 602 may be formed with the remaining conductive material of layer 301 when areas that are not initially protected by photo-resist mask 401 are etched away.

A person skilled in the art will appreciate that other alternative methods and/or approached may be used to achieve various LPLI structures, such as those 601 and 602 illustrated in FIG. 6, without deviation from the spirit of the present invention.

Here, it is to be noted that an LPLI structure is not limited to only those portions of BLI whose height have been lowered. Some portions of a BLI structure that are adjacent to a height-lowered LPLI structure may actually include portion(s) of a LPLI. For example, a BLI structure (or a portion thereof) may be considered as including a via (upper portion of the BLI) formed to be in contact with a LPLI (lower portion of the BLI) underneath thereof. More specifically, as an example illustrated in FIG. 6, the portion of BLI 501b, to the right of FET group 100c and next to LPLI 601, whose height is not lowered may actually be considered to include a via (a top portion of the BLI) formed on top of a portion (a bottom portion of the BLI) of LPLI 601. In other words, LPLI 601 may be considered to include a lower portion of the portion of BLI 501b as being described above. The top portions of bulk local interconnects 501a and 501b that are not etched away during the formation of LPLI may actually be or serve as via or vias, and may be referred to as V0. Apparently, the via and the portion of LPLI underneath the via, as shown in FIG. 6, are formed from the same conductive material, and are actually integrally integrated. The via or vias are formed borderless to FET groups to be directly next to spacers 201 of gate stacks 106 of the FEG groups.

Figure 7:
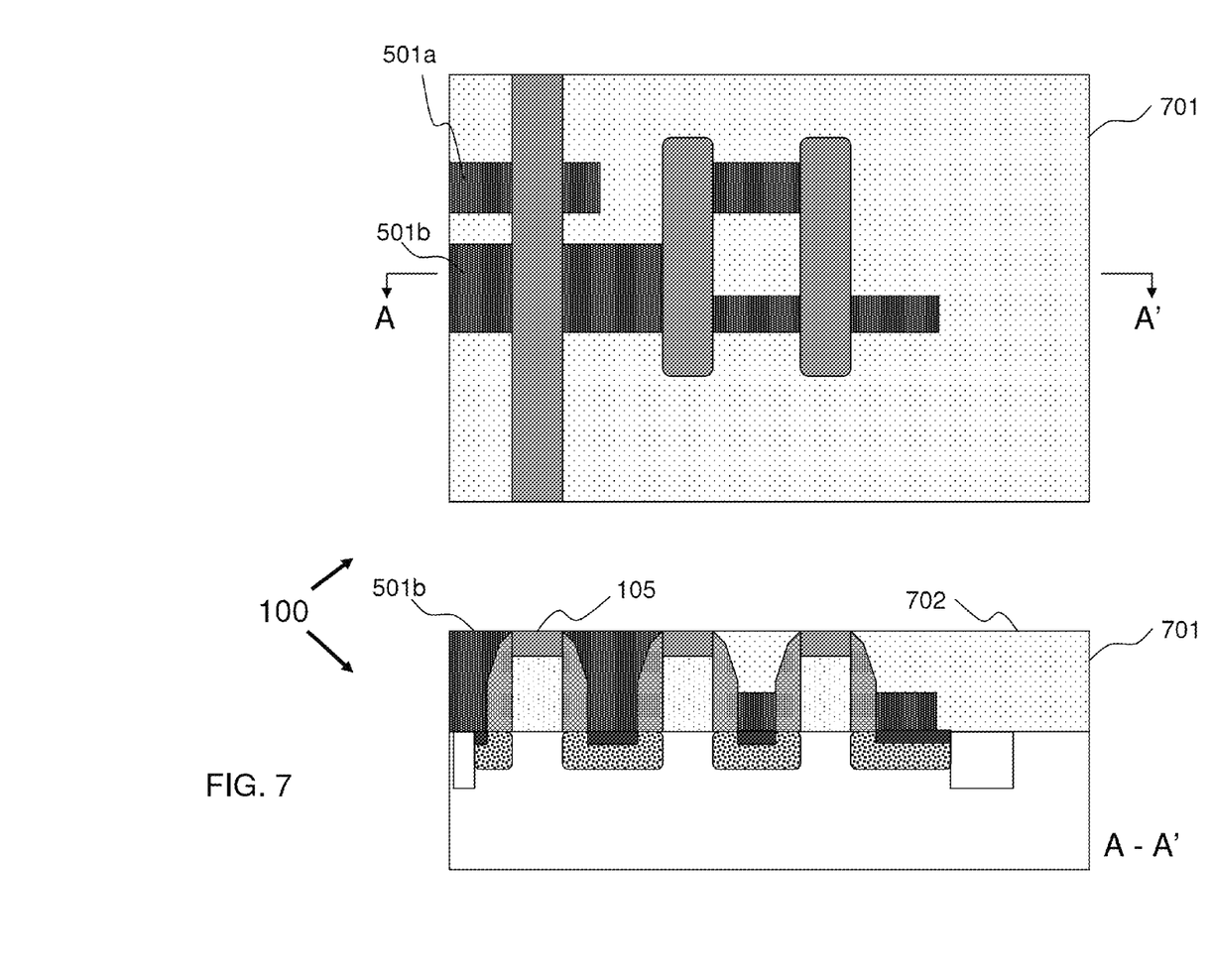
FIG. 7 is a demonstrative illustration of top and cross-sectional views of a semiconductor structure during a process of manufacturing thereof, following the step shown in FIG. 6, according to an embodiment of the present invention.

FIG. 7 is a demonstrative illustration of top and cross-sectional views of semiconductor structure 100 during a process of manufacturing thereof, following the step shown in FIG. 6, according to an embodiment of the present invention. For example, the method may include depositing a layer of insulating material 701 such as, for example, dielectric material to cover semiconductor substrate 101 as well as some or all of the structures and devices formed thereupon so far, including low-profile local interconnects 601 and 602, bulk local interconnects (or vias) 501a and 501b, and cap layers 105. In one embodiment and in a subsequent step, height of insulating layer 701 may be lowered through polishing, strategically using cap layers 105 again as a polish-stopping layer. For example, through polishing, the height of insulating layer 701 may be lowered to have a surface 702 that is coplanar with cap layers 105 and coplanar with top surface of bulk local interconnects (or vias) 501a and 501b. In yet another embodiment, height of insulating layer 701 may be made higher than that of cap layer 105 and M1 conductive path line, which is described below in more details with reference to FIG. 9, may be formed directly inside insulating layer 701 to contact via 501a and/or 501b and gate electrode line 104.

Figure 8:
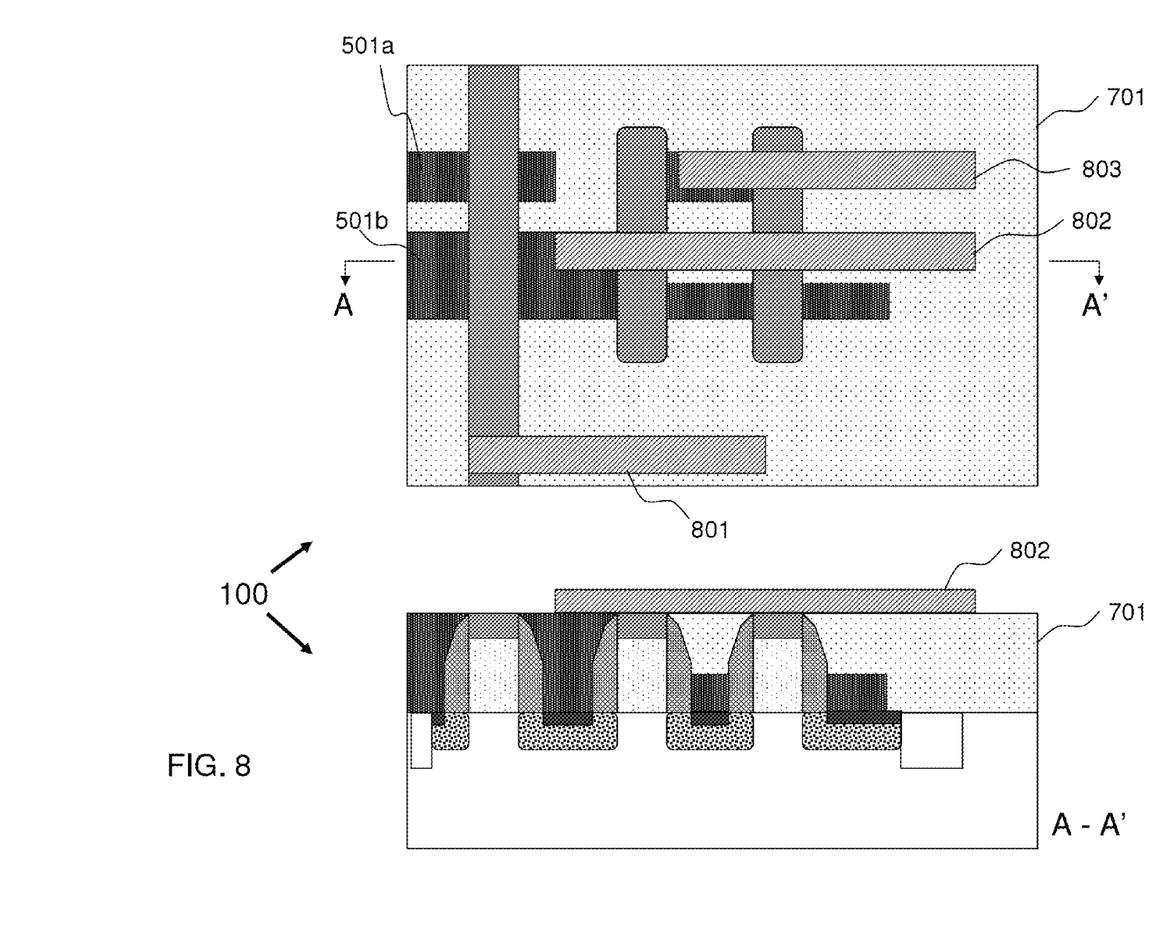
FIG. 8 is a demonstrative illustration of top and cross-sectional views of a semiconductor structure during a process of manufacturing thereof, following the step shown in FIG. 7, according to an embodiment of the present invention.

FIG. 8 is a demonstrative illustration of top and cross-sectional views of semiconductor structure 100 during a process of manufacturing thereof, following the step shown in FIG. 7, according to an embodiment of the present invention. After insulating layer 701 is deposited and made coplanar with via 501a and via 501b, for example, a portion of cap layer 105 on top of FET group 100a may be opened, through for example a selective etching process, to expose underneath gate electrode line 104. In another embodiment, the opening on top of gate electrode line 104 may be formed in a previous step such as, for example, in a step before blanket conductive layer 301 is formed to cover most areas of semiconductor structure 100 including substrate 101 and FET devices 100a, 100b, and 100c (FIG. 3). In this embodiment, the conductive material of blanket layer 301 may fill the opening which may subsequently serve as a conductive stud.

When the opening is formed after insulating layer 701 is deposited and made coplanar with via 501a and via 501b, the opening is subsequently filled with conductive material such as copper (Cu) or aluminum (Al) to form a conductive stud 804 (FIG. 9) which electrically connects the underneath gate electrode line 104 to a M1 level conductive path line that is formed thereafter. For example, one or more M1 conductive path lines 801, 802, and 803 may be formed. More specifically, M1 conductive path line 801 may be made to connect to gate electrode 104 of FET group 100*a*; M1 conductive path line 802 may be made to connect to source/drain of FET group 100*a* and 100*b*; and M1 conductive path line 803 may be made to connect to source/drain of FET group 100*b* and 100*c*, as being demonstratively illustrated in FIG. 8 as an example. Metal path lines or conductive path lines 801, 802, and 803 may be formed to situate directly on top of and in contact with cap layers 105 of FET groups 100*a*, 100*b*, and 100*c*, in contrast to what would normally be required for a gap or certain distance between a M1 conductive path line and the top of cap layer 105 of the FETs. This is made possible by the use of low-profile local interconnect of reduce height.

Conductive path lines 801-803, which may be referred to as metal lines as well in below description, are insulated from the underneath conductive contacts of LPLI 601 and/or 602 by the layer of dielectric material 701. For example, M1 metal line or conductive path line 802 is made able to connect to via in between FET group 100*a* and 100*b* without contacting low-profile local interconnect 602 between FET group 100*b* and 100*c* or LPLI 601 at the right side of FET group 100*c*. It is illustrated in FIG. 8 that M1 metal line or conductive path line 802 is separated from LPLI 601 by dielectric layer 701. Further for example, M1 metal line or conductive path line 803 is able to access via in between FET group 100*b* and 100*c* without contacting LPLI 601 either.

In FIG. 8, it is demonstratively illustrated that metal lines 801, 802, and 803 are formed on top of dielectric layer 801 which may be achieved by applying any existing or future developed techniques. Alternatively, metal lines 801, 802, and 803 may be formed inside dielectric layer 701 with any known or future developed damascene techniques which may involve the use of photolithography, etching, and deposition processes. If the metal lines are formed inside dielectric layer 701, dielectric layer 701 may be formed in the previous step to have a height higher than that of top of cap layer 105, as being demonstratively illustrated in FIG. 9.

Figure 9:
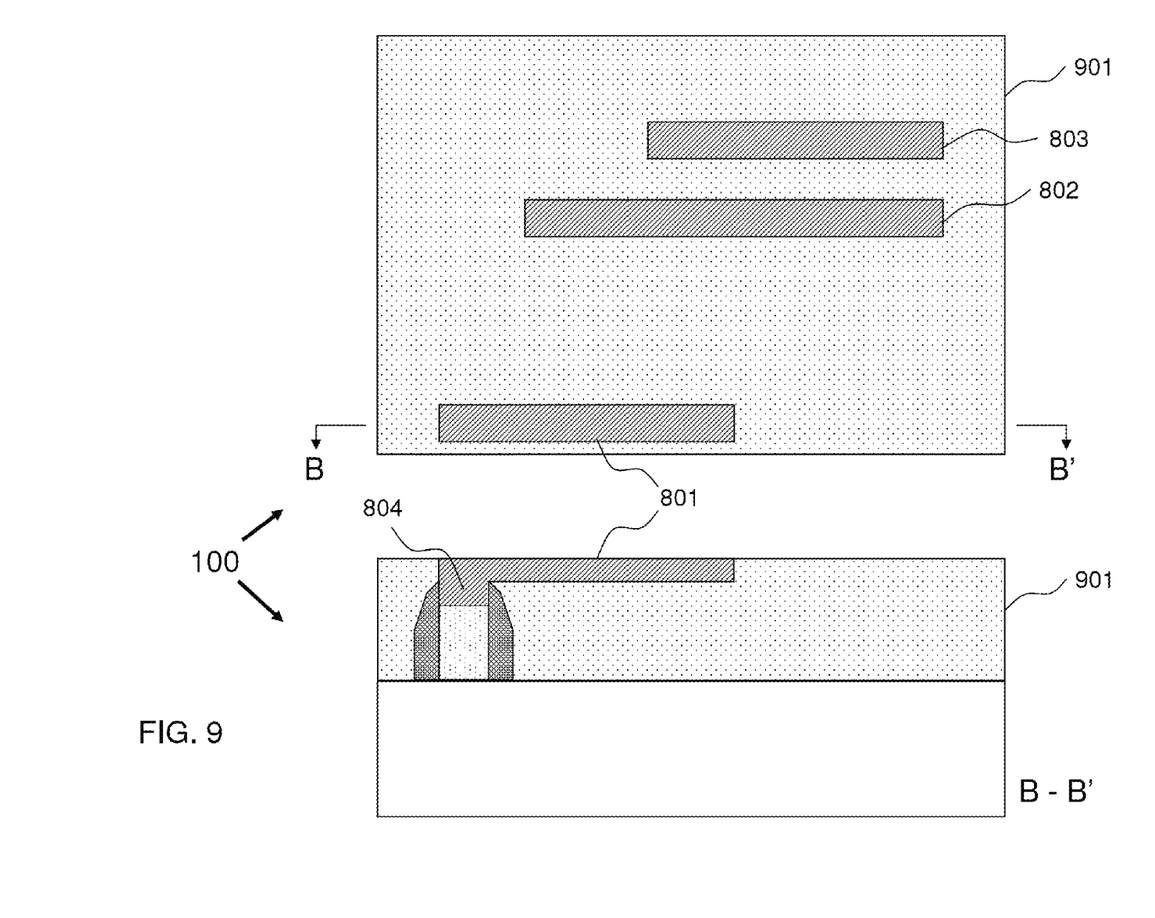
FIG. 9 is a demonstrative illustration of other top and cross-sectional views of a semiconductor structure during a process of manufacturing thereof, following the step shown in FIG. 7, according to an embodiment of the present invention.

FIG. 9 is a demonstrative illustration of other top and cross-sectional views of a semiconductor structure during a process of manufacturing thereof, following the step shown in FIG. 7, according to an embodiment of the present invention. In this embodiment, a dielectric layer 901, instead of dielectric layer 701, may be formed to have a height above and covering the top surface of FET groups 100*a*, 100*b*, and 100*c*. In this case, only damascene-formed M1 metal lines 801, 802, and 803 are visible from the top thereof. A cross-sectional view made at cross-section B-B' (different from previous cross-section A-A') illustrates that M1 metal line 801 is connected to gate electrode 104 of FET group 100*a* with a portion of the cap layer 105 being replaced with some conductive materials such as copper or aluminum which forms conductive stud 804.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A structure comprising:
    a plurality of field-effect-transistors having gate stacks formed on top of a semiconductor substrate, said gate stacks having spacers formed at sidewalls thereof and including a cap layer on top thereof;
    one or more conductive contacts formed directly on top of said semiconductor substrate and interconnecting at least one source/drain of one of said plurality of field-effect-transistors to at least one source/drain of another one of said plurality of field-effect-transistors, wherein said one or more conductive contacts is part of a low-profile local interconnect (LPLI), said LPLI having a height lower than a height of said gate stacks;
    one or more vias formed on top of said one or more conductive contacts and directly next to said spacers of said gate stacks, and
    a conductive path line formed directly above, but not in contact with, said one or more conductive contacts of said LPLI, said conductive path line being formed on top of and in contact with said cap layer of at least one of said gate stacks.

2. The structure of claim 1, wherein said one or more conductive contacts of said LPLI are formed directly adjacent to said spacers of said gate stacks.

3. The structure of claim 1, wherein said one or more vias are made of a same material as that of said one or more conductive contacts, and have a same height as said height of said gate stacks.

4. The structure of claim 1, wherein said conductive path line is insulated from said one or more conductive contacts underneath thereof by a layer of dielectric material.

5. The structure of claim 1, wherein said conductive path line is in contact with at least one of said one or more vias, and is electrically connected to at least one of said one or more conductive contacts through said one or more vias.

6. The structure of claim 1, wherein said conductive path line is in contact with at least one of said gate stacks through an opening formed in said cap layer on top thereof, said opening is filled with a conductive material.

7. A structure comprising:
    a plurality of field-effect-transistors having gate stacks formed on top of a semiconductor substrate, said gate stacks having spacers formed at sidewalls thereof and including a cap layer on top thereof;
    a low-profile local interconnect (LPLI) formed directly on top of said semiconductor substrate, said LPLI having one or more conductive contacts interconnecting a source/drain of one of said plurality of field-effect-transistors to a source/drain of at least another one of said plurality of field-effect-transistors, wherein said LPLI having a height lower than a height of said gate stacks;
    a M1 metal line formed directly above, but not in contact with, said one or more conductive contacts of said LPLI, said M1 metal line being formed on top of and in contact with said cap layer of at least one of said gate stacks, and
    one or more vias formed seamlessly on top of said one or more conductive contacts and directly next to said spacers of said gate stacks, said one or more vias being made of a same material as that of said one or more conductive contacts, and having a same height as said height of said gate stacks.

8. The structure of claim 7, wherein said one or more conductive contacts of said LPLI are formed directly adjacent to a lower portion of said spacers of said gate stacks.

9. The structure of claim 7, wherein said M1 metal line is separated from said one or more conductive contacts underneath thereof by a layer of dielectric material and is in contact with at least one of said one or more vias, and is electrically connected to said LPLI through said one or more vias.

10. The structure of claim 7, wherein said M1 metal line is in contact with at least one of said gate stacks through an opening formed inside said cap layer on top of said one of said gate stacks, said opening being filled with a conductive material.

11. A semiconductor structure providing contacts to a plurality of field-effect-transistors formed on top of a semiconductor substrate, said semiconductor structure comprising:
- a low-profile local interconnect (LPLI) formed directly on top of said semiconductor substrate, said LPLI having one or more conductive contacts interconnecting a source/drain of one of said plurality of field-effect-transistors to a source/drain of at least another one of said plurality of field-effect-transistors, said LPLI having a height lower than a height of gate stacks of said plurality of field-effect-transistors, said gate stacks including a cap layer on top thereof;
- at least one M1 metal line formed directly above, but not in contact with, said one or more conductive contacts of said LPLI, said at least one M1 metal line being formed on top of and in contact with said cap layer of at least one of said gate stacks, and
- one or more vias formed on top of and together with said one or more conductive contacts, said one or more vias being made of a same material as that of said one or more conductive contacts, and having a same height as said height of gate stacks.

12. The semiconductor structure of claim 11, wherein said one or more conductive contacts of said LPLI are formed adjacent to a lower portion of a set of spacers, said set of spacers being formed next to sidewalls of said gate stacks.

13. The structure of claim 11, wherein said at least one M1 metal line is separated from said one or more conductive contacts underneath thereof by a layer of dielectric material and is in contact with at least one of said one or more vias, and thereby is electrically connected to said LPLI through said one or more vias.

14. The structure of claim 13, further comprising another M1 metal line being in contact with at least one of said gate stacks through an opening formed inside said cap layer on top of said one of said gate stacks, said opening being filled with a conductive material.

* * * * *